(12) United States Patent
Sakamoto et al.

(10) Patent No.: US 7,038,504 B2
(45) Date of Patent: May 2, 2006

(54) OUTPUT BUFFER CIRCUIT ELIMINATING HIGH VOLTAGE INSULATED TRANSISTOR AND LEVEL SHIFT CIRCUIT, AND AN INTERFACE CIRCUIT USING THE OUTPUT BUFFER CIRCUIT

(75) Inventors: Kazuo Sakamoto, Kawanishi (JP); Yasunori Nakayama, Ikeda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/889,834

(22) Filed: Jul. 13, 2004

(65) Prior Publication Data
US 2005/0012529 A1 Jan. 20, 2005

(30) Foreign Application Priority Data
Jul. 14, 2003 (JP) ............................. 2003-196473

(51) Int. Cl.
*H03B 1/00* (2006.01)
(52) U.S. Cl. ..................................... 327/112
(58) Field of Classification Search ................ 327/112, 327/333; 326/82–83, 85, 87, 63, 80
See application file for complete search history.

(56) References Cited

U.S. PATENT DOCUMENTS

| | | | |
|---|---|---|---|
| 5,216,516 A | 6/1993 | Tanaka et al. | 358/626 |
| 5,268,853 A | 12/1993 | Tanaka et al. | 364/725 |
| 5,331,585 A | 7/1994 | Tanaka et al. | 364/725 |
| 5,337,168 A | 8/1994 | Fujii et al. | 358/539 |
| 5,349,610 A | 9/1994 | Sakamoto et al. | 375/106 |
| 5,359,549 A | 10/1994 | Tanaka et al. | 364/725 |
| 5,995,010 A * | 11/1999 | Blake et al. | 340/653 |
| 6,040,729 A * | 3/2000 | Sanchez et al. | 327/309 |
| 6,064,227 A * | 5/2000 | Saito | 326/68 |
| 6,081,132 A * | 6/2000 | Isbara | 326/81 |
| 6,268,744 B1* | 7/2001 | Drapkin et al. | 326/81 |
| 6,407,579 B1* | 6/2002 | Goswick | 326/81 |
| 6,518,818 B1* | 2/2003 | Hynes | 327/333 |
| 6,870,407 B1* | 3/2005 | Lundberg | 327/112 |
| 2002/0199026 A1 | 12/2002 | Tsunashima et al. | 709/250 |

FOREIGN PATENT DOCUMENTS

JP 11-41082 2/1999

* cited by examiner

*Primary Examiner*—My-Trang Nu Ton
(74) *Attorney, Agent, or Firm*—Cooper & Dunham LLP

(57) ABSTRACT

A novel output buffer circuit including an input circuit, a voltage generating circuit, and an output circuit forms a three-state buffer circuit. The output circuit includes a first transistor, a second transistor, a third transistor, and a fourth transistor. With such a configuration, a simple circuit using no high voltage insulated transistors and level shift circuits can be made, and the simple circuit can output either a low voltage signal or a high voltage signal responsive to a low voltage input signal, reduce the manufacturing cost and the delay of the risetime of the output signal, which are associated with a high voltage insulated transistor. Furthermore, cost can be reduced by miniaturization of the circuit size.

17 Claims, 4 Drawing Sheets

OUTPUT BUFFER CIRCUIT ELIMINATING HIGH VOLTAGE INSULATED TRANSISTOR AND LEVEL SHIFT CIRCUIT, AND AN INTERFACE CIRCUIT USING THE OUTPUT BUFFER CIRCUIT

BACKGROUND

1. Field

This patent application relates to an output buffer circuit forming a three-state buffer circuit, and more particularly to an output buffer circuit that can be used with a plurality of power voltage sources and without using any high voltage insulated transistors and level shift circuits, and an interface circuit using the output buffer circuit.

2. Description of Related Art

Conventionally, an output buffer circuit includes a high voltage insulated transistor to output a high voltage, for example, 5 Volts (V), and a level shift circuit to convert a gate voltage of a transistor from a predetermined reference voltage to a voltage, for example, 5V, wherein the level shift circuit requires a number of transistors. In FIG. 1, an output buffer circuit 100 is illustrated as such a conventional circuit. The output buffer circuit 100 includes an input circuit 101, a level shift circuit 102, and an output circuit 103, wherein "OE" and "Sin" represent an output enable signal and an input signal, respectively, "VREF", "VCC," and "VEE" represent a reference voltage, a constant voltage, and a ground voltage, respectively. The output circuit 103 includes a P-channel type Metal Oxide Semiconductor transistor (PMOS transistor).

However, providing the high voltage insulated transistor and level shift circuit to the output buffer circuit leads to an increase of manufacturing cost and chip-embedded area due to a number of transistors. Furthermore, the high voltage insulated transistor causes delay of risetime of a signal to be output from an output terminal when a low voltage (e.g., 3.3V) is supplied to a source of the high voltage insulated transistor (PMOS transistor)

SUMMARY

This patent application describes a novel output buffer circuit that can be used with a plurality of power voltage sources and without using any high voltage insulated transistors and level shift circuits, and an interface circuit using the output buffer circuit. In one example, an output buffer circuit, forming a three-state buffer circuit, whose output terminal takes a high impedance state responsive to a received output enable signal and irrelevant to an input signal includes: an input circuit configured to receive the output enable signal and the input signal, and to output a first control signal and a second control signal; a voltage generating circuit configured to receive the first control signal from the input circuit and a power voltage from a terminal of a positive source power voltage, to generate a predetermined reference voltage based upon the first control signal and the power voltage, and to output the predetermined reference voltage; and an output circuit configured to receive the predetermined reference voltage from the voltage generating circuit and the second control signal from the input circuit, and to generate one of an output signal and a specific state to an output terminal of the output buffer circuit. The above-mentioned output circuit includes: a first transistor configured to receive the predetermined reference voltage through a gate thereof from the voltage generating circuit and a power voltage from the terminal of the positive source power voltage through a substrate gate thereof, and to flow electric current to the output terminal; a second transistor connected between the first transistor and the output terminal, and configured to receive a constant voltage through a gate thereof from a constant voltage and a power voltage through a substrate gate thereof from the terminal of the positive source power voltage; a third transistor configured to receive the second control signal through a gate thereof from the input circuit, and to flow electric current from the output terminal to a terminal of a negative source power voltage; and a fourth transistor connected between the output terminal and the third transistor, and configured to receive a predetermined voltage through a gate thereof.

In the above-mentioned output buffer circuit, the first transistor may be a P-channel type MOS transistor and the second transistor may be a P-channel type MOS transistor, and each of the first transistor and the second transistor may have a substrate gate connected to the terminal of the positive source power voltage.

In the above-mentioned output buffer circuit, the gate of the second transistor may receive a voltage smaller than an insulated voltage of the first transistor.

In the above-mentioned output buffer circuit, the voltage generating circuit includes: a connecting circuit configured to receive the first control signal from the input circuit, and connected to the terminal of the negative source power voltage; and a voltage dividing circuit connected to the connecting circuit, and configured to divide a voltage difference between the terminal of the positive source power voltage and the terminal of the negative source power voltage at a predetermined voltage dividing ratio, wherein the voltage generating circuit may output the predetermined reference voltage when the voltage dividing circuit is connected to the terminal of the positive source power voltage and the terminal of the negative source power voltage with the connecting circuit, or may output a power voltage of the positive source power voltage when the voltage dividing circuit is disconnected from the terminal of the negative source power voltage.

In the above-mentioned output buffer circuit, the connecting circuit includes: a sixth transistor configured to receive the first control signal from the input circuit, and to connect the voltage dividing circuit to the terminal of the negative source power voltage; and a seventh transistor connected between the voltage dividing circuit and the sixth transistor, and configured to receive a predetermined voltage through a gate thereof.

In the above-mentioned output buffer circuit, the first through fourth transistors, the voltage generating circuit, and the input circuit may be integrated in one integrated circuit.

This patent specification describes another novel output buffer circuit. In one example, the first transistor may be a P-channel type MOS transistor and the second transistor may be a P-channel type MOS transistor, and the above-mentioned output buffer circuit further includes a fifth transistor configured to supply a voltage smaller than an insulated voltage of the second transistor to the substrate gate of the second transistor responsive to a voltage level of the output terminal.

In the above-mentioned output buffer circuit, the first through fifth transistors, the voltage generating circuit, and the input circuit may be integrated in one integrated circuit.

This patent specification further describes a novel interface circuit, using an output buffer circuit forming a three-state buffer circuit, whose output terminal takes a high impedance state responsive to a received output enable signal and irrelevant to an input signal, wherein the output buffer circuit includes: an input circuit configured to receive the output enable signal and the input signal, and to output a first control signal and a second control signal; a voltage generating circuit configured to receive the first control signal from the input circuit and a power voltage from a terminal of a positive source power voltage, to generate a predetermined reference voltage based upon the first control signal and the power voltage, and to output the predetermined reference voltage; and an output circuit configured to receive the predetermined reference voltage from the voltage generating circuit and the second control signal from the input circuit, and to generate one of an output signal and a specific state to an output terminal of the output buffer circuit. The above-mentioned output circuit includes: a first transistor configured to receive the predetermined reference voltage through a gate thereof from the voltage generating circuit and a power voltage from the terminal of the positive source power voltage through a substrate gate thereof, and to flow electric current to the output terminal; a second transistor connected between the first transistor and the output terminal, and configured to receive a constant voltage through a gate thereof from a constant voltage and a power voltage through a substrate gate thereof from the terminal of the positive source power voltage; a third transistor configured to receive the second control signal through a gate thereof from the input circuit, and to flow electric current from the output terminal to a terminal of a negative source power voltage; and a fourth transistor connected between the output terminal and the third transistor, and configured to receive a predetermined voltage through a gate thereof.

In the above-mentioned interface circuit, the first transistor may be a P-channel type MOS transistor and the second transistor may be a P-channel type MOS transistor, and each of the first transistor and the second transistor may have a substrate gate connected to the terminal of the positive source power voltage.

In the above-mentioned interface circuit, the first transistor may be a P-channel type MOS transistor and the second transistor may be a P-channel type MOS transistor, and the above-mentioned output buffer circuit further includes a fifth transistor configured to supply a voltage smaller than an insulated voltage of the second transistor to a substrate gate of the second transistor responsive to a voltage level of the output terminal.

In the above-mentioned interface circuit, the output buffer circuit may be integrated in one integrated circuit.

BRIEF DESCRIPTION OF THE DRAWINGS

The features of the present application and many of the attendant advantages thereof can be more readily understood from the following detailed description with reference to the accompanying drawings, wherein.

DETAILED DESCRIPTION OF PREFERRED EMBODIMENTS

Figure 1:
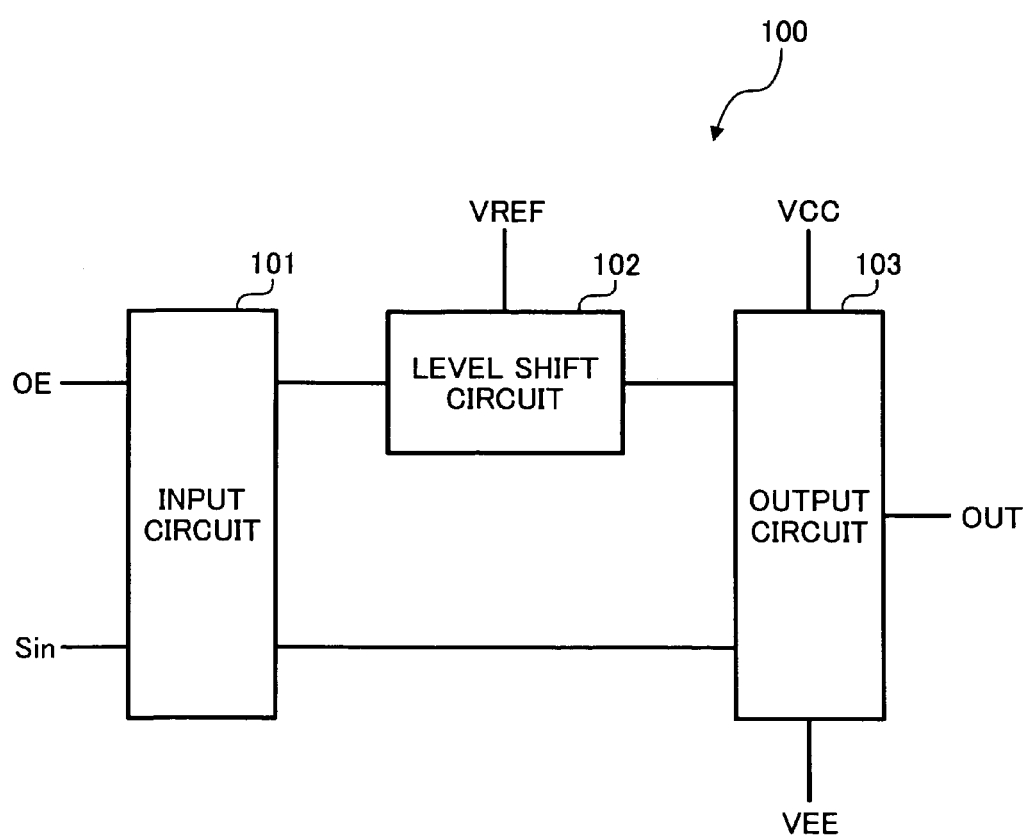
FIG. 1 is an exemplary circuit diagram of a conventional output buffer circuit.

In describing preferred embodiments illustrated in the drawings, specific terminology is employed for the sake of clarity. However, the disclosure of the present patent specification is not intended to be limited to the specific terminology so selected and it is to be understood that each specific element includes all technical equivalents that operate in a similar manner.

Figure 2:
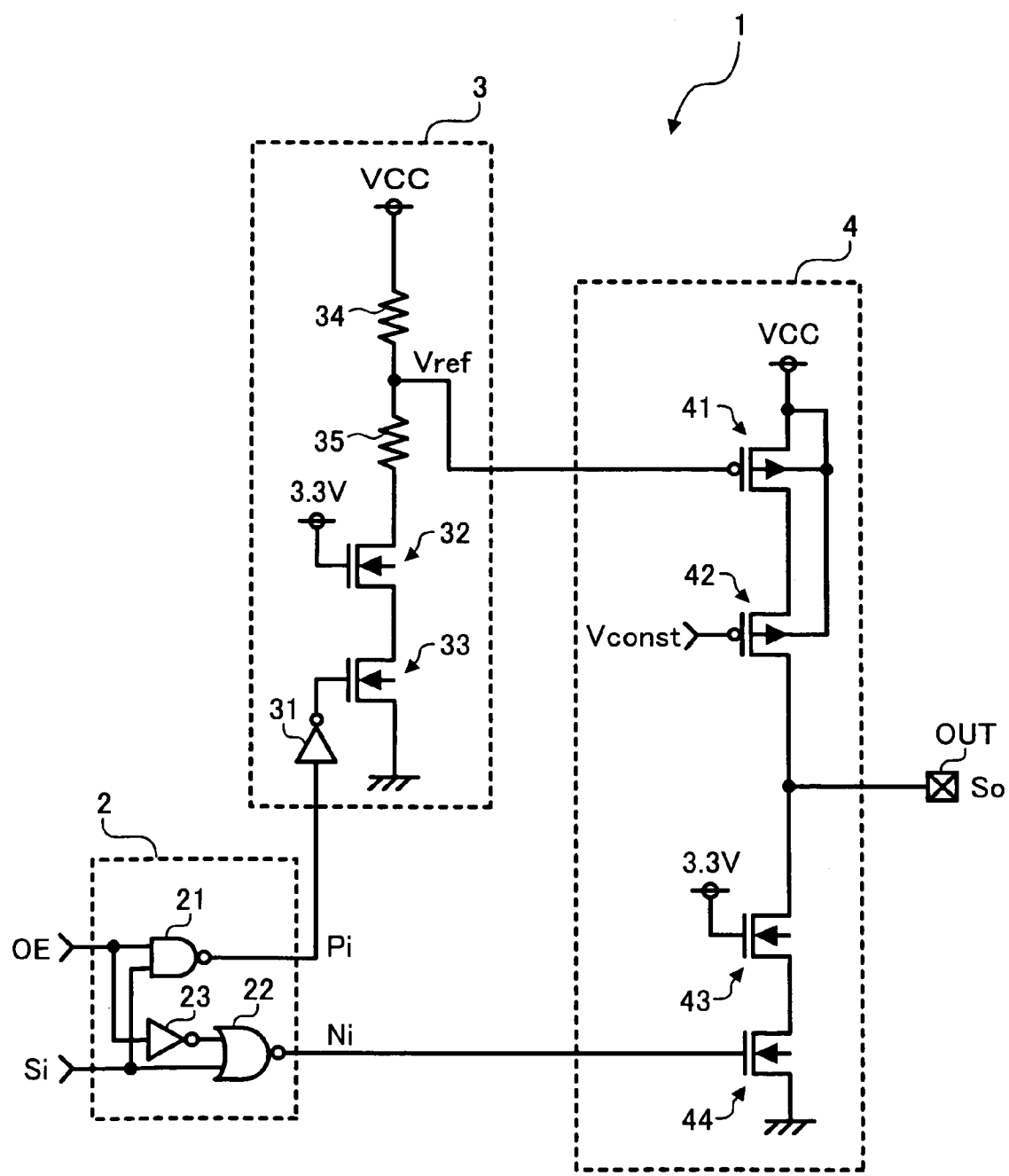
FIG. 2 is an exemplary circuit diagram of an output buffer circuit according to an exemplary embodiment.

Referring now to the drawings, wherein like reference numerals designate identical or corresponding parts throughout the several views, and more particularly to FIG. 2 thereof, an exemplary circuit configuration of an output buffer circuit 1 according to an exemplary embodiment is described.

As illustrated in FIG. 2, the output buffer circuit 1 includes an input circuit 2, a Vref generating circuit 3, and an output circuit 4. The input circuit 2 includes a NAND circuit 21, a NOR circuit 22, and an inverter 23. The Vref generating circuit 3 includes an inverter 31, N-channel type Metal Oxide Semiconductor transistors (hereinafter, referred to as NMOS transistors) 32 and 33, and resistors 34 and 35. The output circuit 4 includes P-channel type MOS transistors (hereinafter, referred to as PMOS transistors) 41 and 42, and NMOS transistors 43 and 44.

The output buffer circuit 1, which forms a three-state buffer circuit, receives an output enable signal OE and an input signal Si, which is a digital signal. Then, the output buffer circuit 1 outputs a signal So from an output terminal OUT responsive to the input signal Si when the output enable signal OE is asserted, or makes the output terminal OUT in a high impedance state when the output enable signal OE is negated.

The input circuit 2 generates and outputs control signals Pi and Ni responsive to the output enable signal OE and the input signal Si, which are input from the outside. The control signals Pi and Ni are also referred to as control signals.

The Vref generating circuit 3 generates and outputs a predetermined voltage Vref responsive to the control signal Pi input from the input circuit 2.

The output circuit 4 generates and outputs a digital signal responsive to the control signal Ni input from the input circuit 2 and the voltage Vref input from the Vref generating circuit 3.

The above-mentioned output buffer circuit 1 formed of the input circuit 2, the Vref generating circuit 3, and the output circuit 4 may be integrated in one integrated circuit.

As for the input circuit 2, the input signal Si is input through each of one input terminal of the NAND circuit 21 and one input terminal of the NOR circuit 22. The output enable signal OE is input through the other input terminal of the NAND circuit 21 and is input through the other input terminal of the NOR circuit 22 through the inverter 23. The NAND circuit 21 outputs the control signal Pi, and the NOR circuit 22 outputs the control signal Ni.

As for the Vref generating circuit 3, the resistors 34 and 35, and the NMOS transistors 32 and 33 are connected in series between a terminal of a positive source power voltage VCC and a terminal of a negative source power voltage, which is a ground voltage. For example, at least one of two voltages, 5V and 3.3V, is selected and input as the power voltage VCC. The NMOS transistor 32 has a gate through which a constant voltage of 3.3V is input, and the NMOS transistor 33 has a gate through which the control signal Pi, output from the input circuit 2, is input through the inverter 31. The gate of a transistor is also referred to as control signal input terminal.

When a threshold voltage of the NMOS transistor 32 is stipulated as Vth1, a drain voltage of the NMOS transistor 33 becomes a voltage defined by a formula "3.3V−Vth1." For example, when the threshold voltage Vth1 is set to 0.6

V, the drain voltage of the NMOS transistor 33 becomes 2.7 V. With such a configuration, the drain voltage of the NMOS transistor 33 can be set to the "3.3V–Vth1" voltage as described above, and the NMOS transistor 33 can avoid using a high voltage insulated transistor having an insulated voltage of 5V or more, even when the power voltage VCC is set to a high voltage, for example, 5V. The voltage Vref is output through one end of the resistor 34 connected to the resistor 35.

As for the output circuit 4, the PMOS transistors 41 and 42, and the NMOS transistors 43 and 44 are connected in series between a terminal of a positive source power voltage VCC and a terminal of a negative source power voltage, which is a ground voltage. An output terminal OUT of the output buffer circuit 1 is provided to one end of the PMOS transistor 42 connected to the NMOS transistor 43. The PMOS transistor 41 has a gate through which the voltage Vref, output from the Vref generating circuit 3, is input, and the PMOS transistor 41 has a substrate gate (also referred to as back gate) through which the power voltage VCC is input.

The PMOS transistor 42 has a gate through which a constant voltage Vconst is input, and the PMOS transistor 42 has a substrate gate through which the power voltage VCC is input. The NMOS transistor 43 has a gate through which a constant voltage of 3.3V is input, and the NMOS transistor 44 has a gate through which the control signal Ni, output from the input circuit 2, is input. The NMOS transistor 43 functions in a similar manner as the NMOS transistor 32. A threshold voltage of the NMOS transistor 43 is also stipulated as Vth1. Therefore, the NMOS transistor 44 can also avoid using a high voltage insulated transistor having an insulated voltage of 5V or more, and the drain voltage of the NMOS transistor 44 can be set to a voltage defined by a formula "3.3V–Vth1", even when the output terminal OUT is set to 5V.

The PMOS transistor 41, PMOS transistor 42, NMOS transistor 44, and NMOS transistor 43 in the output circuit 4 are referred to as a first transistor, a second transistor, a third transistor, and a fourth transistor, respectively.

The Vref generating circuit 3 is referred to as a voltage generating circuit. The resistors 34 and 35 form a voltage dividing circuit. The NMOS transistors 32 and 33, and the inverter 31 form a connecting circuit, wherein the NMOS transistor 32 and the NMOS transistor 33 are referred to as a seventh transistor and a sixth transistor, respectively.

Under such a configuration, both of the control signals Pi and Ni become a low level responsive to the input signal Si of a high level, and both of the control signals Pi and Ni become a high level responsive to the input signal Si of low level when the output enable signal OE becomes a high level and is asserted in the input circuit 2. The control signals Pi and Ni become a high level and a low level, respectively, irrelevant with signal levels of the input signal Si when the output enable signal OE becomes a low level and is negated in the input circuit 2.

With the above-described configuration, the output buffer circuit 1 performs operation under different conditions. First operational parameter conditions, in which the power voltage VCC is set to 5V, the constant voltage Vconst is set to 1.8V, and the input signal Si varies from a high level of 3.3V to a low level of 0 V, is set for following cases.

Under such operational parameter conditions, one exemplary case is made, in which the control signal Pi is in a high level of 3.3V and the control signal Ni is in a low level of 0 V. The voltage Vref becomes 5V because the NMOS transistor 33 shifts to an "off" state (shutdown state) when the control signal Pi of a high level is input in the Vref generating circuit 3. The output terminal OUT becomes a high impedance state because both of the PMOS transistor 41 and the NMOS transistor 44 in the output circuit 4 shift to an "off" state (shutdown state).

Another exemplary case is made under the same operational parameter conditions, in which both of the control signals Pi and Ni are in a low level of 0 V. The NMOS transistor 33 shifts to an "on" state when the control signal Pi of a low level is input in the Vref generating circuit 3. The voltage Vref becomes a voltage, which is obtained by dividing the power voltage VCC of 5V at a ratio defined by an ohmic value of the resistor 34 and a combined ohmic value calculated with an ohmic value of the resistor 35 and ohmic values of the NMOS transistors 32 and 33 in "on" state, and drops less than 5V. Therefore, each of the ohmic values of the resistors 34 and 35 is set to a certain level so that the voltage Vref does not exceed a range of a rated insulated voltage of voltage Vgs, applied between the gate and the source of the PMOS transistor 41, while the voltage Vref shifts the PMOS transistor 41 to an "on" state. For example, the ohmic values of the resistors 34 and 35 are set to 15 KΩ and 5 KΩ, respectively, in this case. In such away, the PMOS transistor 41 can avoid using a high voltage insulated transistor having an insulated voltage of 5V or more.

On one hand, the NMOS transistor 44 in the output circuit 4 shifts to an "off" state (shutdown state). When both of the PMOS transistors 41 and 42 shift to an "on" state, and the drain voltage of the PMOS transistor 41 becomes 5V, the PMOS transistor 42, to a gate thereof a voltage of 1.8V is input, also shifts to an "on" state. Thereby the output terminal OUT outputs 5V, which is a high level. At this time, the substrate gate of the PMOS transistor 42 becomes 5V; therefore, the PMOS transistor 42 can also avoid using a high voltage insulated transistor having an insulated voltage of 5V or more.

Another exemplary case is made under the same operational parameter conditions, in which both of the control signals Pi and Ni are in a high level of 3.3V. The NMOS transistor 33 shifts to an "off" state when the control signal Pi of a high level is input in the Vref generating circuit 3. Therefore, the voltage Vref becomes 5V which is supplied by the power voltage VCC, and the PMOS transistor 41 shifts to an "off" state (shutdown state). Because the NMOS transistor 44 and the PMOS transistor 41 in the output circuit 4 shift to an "on" state and an "off" state (shutdown state) respectively, the output terminal OUT becomes a low level of 0 V. When a threshold voltage of the PMOS transistor 42 is stipulated as Vth2, a source voltage of the PMOS transistor 42, that is, a drain voltage of the PMOS transistor 41 becomes a voltage defined by a formula "1.8V+Vth2". Therefore, the PMOS transistor 41 can also avoid using a high voltage insulated transistor having an insulated voltage of 5V or more.

Second operational parameter conditions, in which the power voltage VCC is set to 3.3V, the constant voltage Vconst is set to 0 V, and the input signal Si is set to a high level of 3.3V, is set for following cases.

Under such operational parameter conditions, one exemplary case is made, in which the control signal Pi is in a high level of 3.3V and the control signal Ni is in a low level of 0 V. The voltage Vref becomes 3.3V because the NMOS transistor 33 shifts to an "off" state (shutdown state) when the control signal Pi of a high level is input in the Vref generating circuit 3. Both of the PMOS transistor 41 and the NMOS transistor 44 in the output circuit 4 shift to an "off"

state (shutdown state). Therefore, the output terminal OUT becomes a high impedance state.

Another exemplary case is made under the same operational parameter conditions, in which both of the control signals Pi and Ni are in a low level of 0 V. The NMOS transistor 33 shifts to an "on" state when the control signal Pi of a low level is input in the Vref generating circuit 3. The voltage Vref becomes a voltage, which is obtained by dividing the power voltage VCC of 3.3V at a ratio defined by an ohmic value of the resistor 34 and a combined ohmic value calculated with an ohmic value of the resistor 35 and ohmic values of the NMOS transistors 32 and 33 in "on", state, and drops less than 3.3V. Therefore, the voltage Vref shifts the PMOS transistor 41 to an "on" state.

On one hand, the NMOS transistor 44 in the output circuit 4 shifts to an "off" state (shutdown state). The output terminal OUT outputs 3.3V, which is a high level, because a voltage of 0 V is input through a gate of the PMOS transistor 42, also shifts to an "on" state when the drain voltage of the PMOS transistor 41 becomes 3.3V. At this time, when the gate voltage of the PMOS transistor 42 is set to 1.8V as in the case of the above-described first operational parameter conditions, a risetime of a signal output from the output terminal OUT becomes longer, consequently, a rising characteristic of the signal output from the output terminal OUT deteriorates. Therefore, the gate voltage of the PMOS transistor 42 is changed from 1.8V to 0 V to correct this situation.

Another exemplary case under the same operational parameter conditions, in which both of the control signals Pi and Ni are in a high level of 3.3V, will be explained. The NMOS transistor 33 shifts to an "off" state when the control signal Pi of a high level is input in the Vref generating circuit 3. Therefore, the voltage Vref becomes 3.3V which is supplied by the power voltage VCC, and the PMOS transistor 41 shifts to an "off" state (shutdown state). And the output terminal OUT becomes low level of 0 V because the NMOS transistor 44 and the PMOS transistor 41 in the output circuit 4 shift to an "on" state and an "off" state (shutdown state), respectively.

Figure 3:
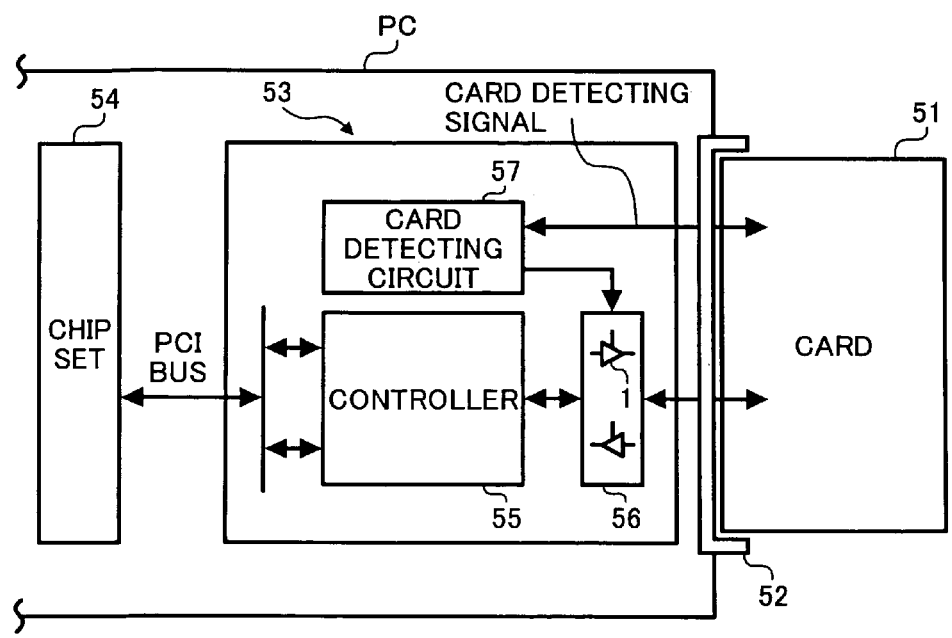
FIG. 3 is an exemplary interface circuit using the output buffer circuit of FIG. 2.

This patent application describes a case of applying the above-described output buffer circuit 1 to an interface circuit. FIG. 3 is an exemplary block diagram of an interface circuit using the output buffer circuit 1, and explains an exemplary interface circuit for a PC card used for a personal computer. As illustrated in FIG. 3, a card adaptor connected with a smart card or the like, or a PC card connector 52 connected with a card 51 such as a PC card is coupled to a chip set 54 through a PC card controller 53. The PC card controller 53 includes a controller 55 such as a PCMCIA (Personal Computer Memory Card International Association) controller, an USB (Universal Serial Bus) host controller or the like, an interface circuit 56, and a card detecting circuit 57.

The chip set 54 outputs a signal to the controller 55, and the signal is output to the card 51 connected to the PC card connector 52 through at least one output buffer circuit 1 in the interface circuit 56. The card detecting circuit 57 identifies types of the card 51 connected to the PC card connector 52 because a PC card is operated with 3.3V, and a smart card is operated with 5V. The card detecting circuit 57 is responsive to the result of such identification and changes the voltage of the power voltage VCC and the voltage of the constant voltage Vconst, which are to be output to the output buffer circuit 1 in the interface circuit 56.

That is, the card detecting circuit 57 outputs the power voltage VCC of 3.3V and the constant voltage Vconst of 0 V to the output buffer circuit 1 when the PC card is connected to the PC card connector 52, and similarly, outputs the power voltage VCC of 5V and the constant voltage Vconst of 1.8V to the output buffer circuit 1 when the smart card is connected to the PC card connector 52.

A constant voltage circuit (not shown) may supply the power voltage VCC and the constant voltage Vconst to be output to the output buffer circuit 1. The constant voltage circuit outputs 3.3V or 5V for VCC and 0 V or 1.8V for Vconst selectively responsive to a control signal output from the card detecting circuit 57. In this case, the constant voltage circuit may continuously supply the voltage to gates of the NMOS transistors 32 and 33.

Accordingly, the output buffer circuit 1 of FIG. 2 changes the voltage Vref, which is a gate voltage of the PMOS transistor 41, responsive to the power voltage VCC, and changes the gate voltage of the PMOS transistor 42 responsive to the power voltage VCC by connecting the PMOS transistor 42 and the PMOS transistor 41 in series.

With such a configuration, a simple circuit using no high voltage insulated transistors and level shift circuits can be made according to the present invention, and the simple circuit can output either a low voltage signal of 3.3V or a high voltage signal of 5V responsive to a low voltage input signal of 3.3V, while reducing the manufacturing cost and the delay of the risetime of the output signal, which are associated with a high voltage insulated transistor. Furthermore, the present invention can reduce the cost by miniaturization of the circuit size.

Figure 4:
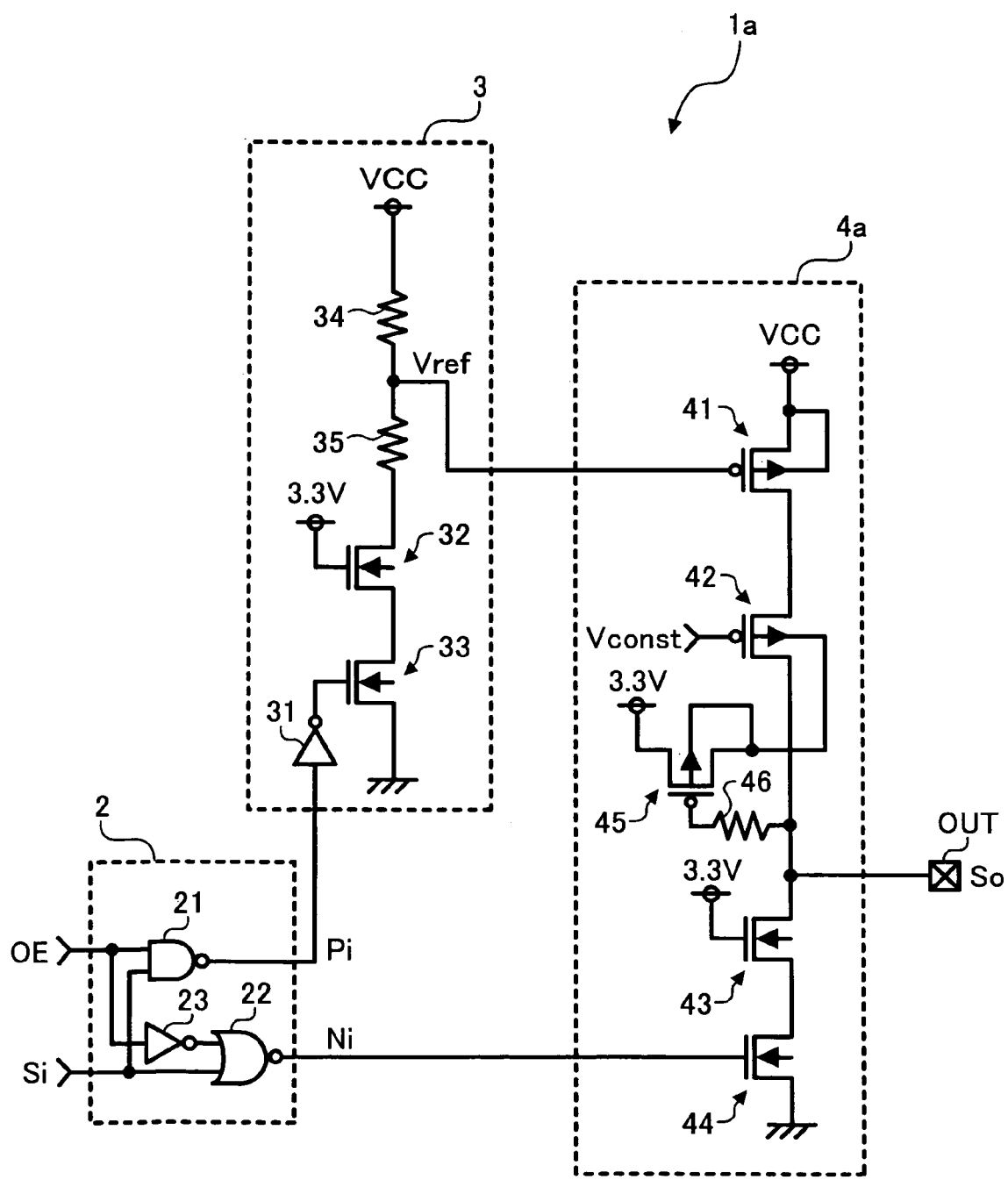
FIG. 4 is an exemplary circuit diagram of an output buffer circuit according to another exemplary embodiment.

In some cases, a high voltage insulated transistor should be used for the PMOS transistor 42 in FIG. 2 when the power voltage VCC is set to 5V and the output terminal OUT is set to a low level because a voltage difference between the drain and the substrate gate of the PMOS 42 becomes 5V. To cope with such a situation, another output buffer circuit according to another exemplary embodiment is provided. In such an output buffer circuit, a voltage at the substrate gate of the PMOS 42 is lowered when the output terminal OUT is set to a low level. FIG. 4 is an exemplary circuit diagram of the output buffer circuit.

As is illustrated in FIG. 4, the output buffer circuit has like reference numerals designating identical or corresponding parts illustrated in FIG. 2, thus the explanations for such parts are omitted, and only the differences with FIG. 2 will be explained hereinafter.

FIG. 4 differs from FIG. 2 in that a PMOS transistor 45, which is a fifth transistor, and a resistor 46 are added to the output circuit 4 illustrated in FIG. 2. Based on these changes, the output circuit 4 and the output buffer circuit 1 illustrated in FIG. 2 are replaced with an output circuit 4a and an output buffer circuit 1a, respectively, in FIG. 4.

The output circuit 4a of FIG. 4 includes the PMOS transistors 41, 42, and 45, the NMOS transistors 43 and 44, and the resistor 46. The PMOS transistor 45 is connected between a voltage of 3.3V and the substrate gate of the PMOS transistor 42. The resistor 46 is connected between the output terminal OUT and a gate of the PMOS transistor 45. A substrate gate of the PMOS transistor 45 is connected to the substrate gate of the PMOS transistor 42.

Under such a configuration, first exemplary operational parameter conditions, in which the power voltage VCC is set to 5V and the constant voltage Vconst is set to 1.8V, is set for following cases. When the output terminal OUT is set to a high level, the PMOS transistor 45 shifts to an "off" state (shutdown state), resulting in a voltage at the substrate gate of the PMOS transistor 42 of 5V. When the output terminal OUT is set to a low level, the PMOS transistor 45 shifts to an "on" state, resulting in a voltage at the substrate gate of the PMOS transistor 42 of 3.3V.

Similarly, second exemplary operational parameter conditions, in which the power voltage VCC is set to 3.3V and the constant voltage Vconst is set to 0V, are set for following cases. When the output terminal OUT is set to a high level, the PMOS transistor 45 shifts to an "off" state (shutdown state), resulting in a voltage at the substrate gate of the PMOS transistor 42 of 3.3V. When the output terminal OUT is set to a low level, the PMOS transistor 45 shifts to an "on" state, and resulting in a voltage at the substrate gate of the PMOS transistor 42 of 3.3V.

As described above, the output buffer circuit of FIG. 4 is configured so that the PMOS transistor 45 shifts to an "on" state and the substrate gate of the PMOS transistor 42 becomes 3.3V when the output terminal OUT is set to a low level. Accordingly, the output buffer circuit of FIG. 4 can achieve an effect similar to the output buffer circuit of FIG. 2, and the voltage of the substrate gate of the PMOS transistor 42 can be set to 3.3V even when the output terminal OUT is set to a low level. Therefore, the PMOS transistor 42 can avoid using a high voltage insulated transistor.

With such a configuration, a simple circuit using no high voltage insulated transistors and level shift circuits can be made according to the present invention, and the simple circuit can output either a low voltage signal of 3.3V or a high voltage signal of 5V responsive to a low voltage input signal of 3.3V, while reducing the manufacturing cost and the delay of the risetime of the output signal, which are associated with a high voltage insulated transistor. Furthermore, the present invention can reduce the cost by miniaturization of the circuit size.

Numerous additional modifications and variations are possible in light of the above teachings. It is therefore to be understood that within the scope of the appended claims, the disclosure of the present patent specification may be practiced otherwise than as specifically described herein. For example, elements and/or features of different illustrative embodiments may be combined with each other and/or substituted for each other within the scope of this disclosure and appended claims.

This application claims priority from Japanese patent application No. 2003-196473 filed on Jul. 14, 2003, in the Japan Patent Office, the entire contents of which are hereby incorporated by reference herein.

What is claimed is:

1. A three-state output buffer circuit, comprising:
   an input circuit configured to receive an output enable signal and an input signal, and to output a first control signal and a second control signal;
   a voltage generating circuit configured to receive the first control signal from the input circuit and a power voltage from a terminal of a positive source power voltage, to generate a predetermined reference voltage based upon the first control signal and the power voltage, and to output the predetermined reference voltage; and
   an output circuit configured to receive the predetermined reference voltage from the voltage generating circuit and the second control signal from the input circuit, and to generate one of an output signal and a specific state to an output terminal of the output buffer circuit,
   wherein the output circuit comprises:
   a first transistor configured to receive through a gate thereof the predetermined reference voltage from the voltage generating circuit and through a substrate gate thereof the power voltage from the terminal of the positive source power voltage, and to flow electric current to the output terminal of the output buffer circuit;
   a second transistor connected between the first transistor and the output terminal of the output buffer circuit, and configured to receive a constant voltage through a gate thereof from a constant voltage source;
   a third transistor configured to receive through a gate thereof the second control signal from the input circuit, and to flow electric current from the output terminal of the output buffer circuit to a terminal of a negative source power voltage;
   a fourth transistor connected between the output terminal of the output buffer circuit and the third transistor, and configured to receive a predetermined voltage through a gate of the fourth transistor; and
   a fifth transistor configured to supply a voltage smaller than an insulated voltage of the second transistor, to the substrate gate of the second transistor.

2. The output buffer circuit according to claim 1, wherein the first transistor is a P-channel type MOS transistor and the second transistor is a P-channel type MOS transistor, and the substrate gate of the first transistor is connected to the terminal of the positive source power voltage.

3. The output buffer circuit according to claim 2, wherein the voltage generating circuit comprises:
   a connecting circuit configured to receive the first control signal from the input circuit, and connected to the terminal of the negative source power voltage; and
   a voltage dividing circuit connected to the connecting circuit, and configured to divide a voltage difference between the terminal of the positive source power voltage and the terminal of the negative source power voltage at a predetermined voltage dividing ratio,
   wherein the voltage generating circuit outputs the predetermined reference voltage when the voltage dividing circuit is connected to the terminal of the positive source power voltage and the terminal of the negative source power voltage through the connecting circuit, or outputs the power voltage of the positive source power voltage when the voltage dividing circuit is disconnected from the terminal of the negative source power voltage.

4. The output buffer circuit according to claim 3, wherein the connecting circuit comprises:
   a sixth transistor configured to receive the first control signal from the input circuit, and to connect the voltage dividing circuit to the terminal of the negative source power voltage; and
   a seventh transistor connected between the voltage dividing circuit and the sixth transistor, and configured to receive a predetermined voltage through a gate thereof.

5. The output buffer circuit according to claim 1, wherein the first through fifth transistors, the voltage generating circuit, and the input circuit are integrated in one integrated circuit.

6. The output buffer circuit according to claim 1, wherein the first transistor is a P-channel type MOS transistor and the second transistor is a P-channel type MOS transistor, and the voltage supplied by said fifth transistor to the substrate gate of the second transistor is responsive to a voltage level of the output terminal.

7. The output buffer circuit according to claim 6, wherein the first through fifth transistors, the voltage generating circuit, and the input circuit are integrated in one integrated circuit.

8. The output buffer circuit of claim 1, wherein the voltage generating circuit includes first and second resistors having first and second resistances, respectively, and said first and second resistors forming a voltage dividing circuit to generate the predetermined reference voltage.

9. The output buffer circuit of claim 8, wherein the predetermined reference voltage is smaller than an insulated voltage of said first transistor.

10. An interface circuit using a three-state output buffer circuit, wherein the output buffer circuit comprises:
an input circuit configured to receive an output enable signal and an input signal, and to output a first control signal and a second control signal;
a voltage generating circuit configured to receive the first control signal from the input circuit and a power voltage from a terminal of a positive source power voltage, to generate a predetermined reference voltage based upon the first control signal and the power voltage, and to output the predetermined reference voltage; and
an output circuit configured to receive the predetermined reference voltage from the voltage generating circuit and the second control signal from the input circuit, and to generate one of an output signal and a specific state to an output terminal of the output buffer circuit,
wherein the output circuit comprises:
a first transistor configured to receive the predetermined reference voltage through a gate thereof from the voltage generating circuit and the power voltage from the terminal of the positive source power voltage through a substrate gate thereof, and to flow electric current to the output terminal;
a second transistor connected between the first transistor and the output terminal, and configured to receive a constant voltage through a gate thereof from a constant voltage source;
a third transistor configured to receive the second control signal through a gate thereof from the input circuit, and to flow electric current from the output terminal to a terminal of a negative source power voltage;
a fourth transistor connected between the output terminal and the third transistor, and configured to receive a predetermined voltage through a gate thereof; and
a fifth transistor configured to supply a voltage smaller than an insulated voltage of the second transistor, to the substrate gate of the second transistor.

11. The interface circuit according to claim 10, wherein the first transistor is a P-channel type MOS transistor and the second transistor is a P-channel type MOS transistor, and the substrate gate of the first transistor is connected to the terminal of the positive source power voltage.

12. The interface circuit according to claim 11, wherein the output buffer circuit is integrated in one integrated circuit.

13. The interface circuit according to claim 10, wherein the first transistor is a P-channel type MOS transistor and the second transistor is a P-channel type MOS transistor, and the voltage supplied by said fifth transistor to the substrate gate of the second transistor is responsive to a voltage level of the output terminal.

14. The interface circuit according to claim 13, wherein the output buffer circuit is integrated in one integrated circuit.

15. The interface circuit according to claim 10, wherein the output buffer circuit is integrated in one integrated circuit.

16. A three-state output buffer circuit comprising:
an input circuit configured to receive an output enable signal and an input signal, and to output a first control signal and a second control signal;
a voltage generating circuit including a voltage dividing circuit comprising first and second resistors having first and second resistances, respectively, wherein said voltage generating circuit generates a predetermined reference voltage based upon said first and second resistances and a power voltage from a terminal of a positive source power voltage, when said voltage generating circuit receives the first control signal from the input circuit; and
an output circuit configured to receive the predetermined reference voltage from the voltage generating circuit and the second control signal from the input circuit, and to generate one of an output signal and a specific state to an output terminal of the output buffer circuit,
wherein the output circuit comprises:
a first transistor configured to receive through a gate thereof the predetermined reference voltage from the voltage generating circuit and through a substrate gate thereof the power voltage from the terminal of the positive source power voltage, and to flow electric current to the output terminal of the output buffer circuit;
a second transistor connected between the first transistor and the output terminal of the output buffer circuit, and configured to receive a constant voltage through a gate thereof from a constant voltage;
a third transistor configured to receive through a gate thereof the second control signal from the input circuit, and to flow electric current from the output terminal of the output buffer circuit to a terminal of a negative source power voltage;
a fourth transistor connected between the output terminal of the output buffer circuit and the third transistor, and configured to receive a predetermined voltage through a gate of the fourth transistor; and
a fifth transistor configured to supply a voltage smaller than an insulated voltage of the second transistor, to a substrate gate of the second transistor.

17. The output buffer circuit of claim 16, wherein the predetermined reference voltage is smaller than an insulated voltage of said first transistor.

* * * * *